(12) United States Patent
Andrews et al.

(10) Patent No.: US 9,099,616 B2
(45) Date of Patent: Aug. 4, 2015

(54) LIGHT EMITTER PACKAGES AND DEVICES HAVING IMPROVED WIRE BONDING AND RELATED METHODS

(75) Inventors: Peter Scott Andrews, Durham, NC (US); Sung Chul Joo, Cary, NC (US)

(73) Assignee: Cree, Inc., Durham, NC (US)

( * ) Notice: Subject to any disclaimer, the term of this patent is extended or adjusted under 35 U.S.C. 154(b) by 119 days.

(21) Appl. No.: 13/603,586

(22) Filed: Sep. 5, 2012

(65) Prior Publication Data

US 2013/0193455 A1    Aug. 1, 2013

Related U.S. Application Data

(60) Provisional application No. 61/531,483, filed on Sep. 6, 2011.

(51) Int. Cl.
*H01L 33/62* (2010.01)
*H01L 33/48* (2010.01)
(Continued)

(52) U.S. Cl.
CPC ............... *H01L 33/48* (2013.01); *H01L 24/29* (2013.01); *H01L 24/45* (2013.01); *H01L 24/83* (2013.01); *H01L 24/85* (2013.01); *H01L 25/0753* (2013.01); *H01L 24/32* (2013.01); *H01L 24/48* (2013.01); *H01L 24/78* (2013.01); *H01L 2224/2919* (2013.01); *H01L 2224/2929* (2013.01); *H01L 2224/29191* (2013.01); *H01L 2224/29339* (2013.01); *H01L 2224/32225* (2013.01); *H01L 2224/32245* (2013.01); *H01L 2224/45015* (2013.01); *H01L 2224/45139* (2013.01); *H01L 2224/45144* (2013.01); *H01L 2224/45147* (2013.01);

(Continued)

(58) Field of Classification Search
CPC ......... H01L 33/48; H01L 33/62; H01L 33/64; H01L 24/85
USPC .................. 257/88, 98–99; 438/27
See application file for complete search history.

(56) References Cited

U.S. PATENT DOCUMENTS

| 4,946,547 A | 8/1990 | Palmour |
| 5,200,022 A | 4/1993 | Kong |

(Continued)

FOREIGN PATENT DOCUMENTS

| JP | 2010-041061 | 2/2010 |
| JP | 2011-129658 | 6/2011 |

(Continued)

OTHER PUBLICATIONS

Non-Final Office Action for U.S. Appl. No. 12/479,318 dated Jun. 2, 2010.

(Continued)

*Primary Examiner* — Nathan Ha
(74) *Attorney, Agent, or Firm* — Jenkins, Wilson, Taylor & Hunt, P.A.

(57) ABSTRACT

Light emitter packages and devices having improved wire bonding and related methods are disclosed. In one embodiment a light emitter package can include at least one light emitting diode (LED) chip electrically connected to an electrical element via a wire bond. The wire bond can be provided at improved wire bonding parameters such as a temperature of approximately 150° C. or less, a bonding time of approximately 100 ms or less, a power of approximately 1700 mW or less, and a force of approximately 100 grams force (gf) or less, or combinations thereof.

26 Claims, 5 Drawing Sheets

(51) Int. Cl.
*H01L 23/00* (2006.01)
*H01L 25/075* (2006.01)

(52) U.S. Cl.
CPC ............... *H01L 2224/45565* (2013.01); *H01L 2224/45644* (2013.01); *H01L 2224/48091* (2013.01); *H01L 2224/48227* (2013.01); *H01L 2224/48247* (2013.01); *H01L 2224/48465* (2013.01); *H01L 2224/49113* (2013.01); *H01L 2224/73265* (2013.01); *H01L 2224/78301* (2013.01); *H01L 2224/8385* (2013.01); *H01L 2224/85181* (2013.01); *H01L 2224/85205* (2013.01); *H01L 2224/92247* (2013.01); *H01L 2924/01006* (2013.01); *H01L 2924/01013* (2013.01); *H01L 2924/01014* (2013.01); *H01L 2924/01029* (2013.01); *H01L 2924/01047* (2013.01); *H01L 2924/01322* (2013.01); *H01L 2924/10155* (2013.01); *H01L 2924/12041* (2013.01); *H01L 2924/20102* (2013.01); *H01L 2924/20103* (2013.01); *H01L 2924/20104* (2013.01); *H01L 2924/3011* (2013.01); *H01L 2933/0033* (2013.01); *H01L 2933/0066* (2013.01)

(56) References Cited

U.S. PATENT DOCUMENTS

| | | | |
|---|---|---|---|
| RE34,861 E | 2/1995 | Davis | |
| 7,242,032 B2* | 7/2007 | Oshio | 257/99 |
| 7,381,996 B2 | 6/2008 | Hsin Chen | |
| 7,456,499 B2 | 11/2008 | Loh et al. | |
| 7,719,024 B2 | 5/2010 | Bando | |
| 7,808,013 B2* | 10/2010 | Mendendorp et al. | 257/99 |
| 7,834,375 B2* | 11/2010 | Andrews | 257/100 |
| 7,851,812 B2* | 12/2010 | Behringer et al. | 257/88 |
| 7,923,739 B2 | 4/2011 | Hussell | |
| 8,058,088 B2 | 11/2011 | Cannon | |
| 8,461,613 B2* | 6/2013 | Chou et al. | 257/99 |
| 8,502,261 B2* | 8/2013 | Loh | 257/99 |
| 8,835,952 B2* | 9/2014 | Andrews et al. | 257/98 |
| 2002/0027010 A1* | 3/2002 | Glenn | 174/52.2 |
| 2004/0126913 A1 | 7/2004 | Loh | |
| 2006/0186418 A1 | 8/2006 | Edmond | |
| 2007/0158668 A1 | 7/2007 | Tarsa | |
| 2008/0173884 A1 | 7/2008 | Chitnis | |
| 2008/0179611 A1 | 7/2008 | Chitnis | |
| 2008/0258130 A1 | 10/2008 | Bergmann | |
| 2009/0032976 A1 | 2/2009 | Misumi et al. | |
| 2009/0189178 A1 | 7/2009 | Kim et al. | |
| 2009/0315057 A1* | 12/2009 | Konishi et al. | 257/98 |
| 2010/0155763 A1 | 6/2010 | Donofrio | |
| 2010/0190298 A1 | 7/2010 | Kuramoto et al. | |
| 2012/0018768 A1* | 1/2012 | Li et al. | 257/99 |

FOREIGN PATENT DOCUMENTS

| | | |
|---|---|---|
| JP | 2011-146567 | 7/2011 |
| WO | WO 2013/036481 | 3/2013 |

OTHER PUBLICATIONS

Non-Final Office Action for U.S. Appl. No. 12/479,318 dated Nov. 10, 2010.
Notice of Allowance for U.S. Appl. No. 12/479,318 dated Feb. 17, 2011.
Notice of Allowance for U.S. Appl. No. 12/479,318 dated Apr. 5, 2011.
International Search Report and Written Opinion for Application No. PCT/US2012/053662 dated Feb. 25, 2013.
Taiwanese Office Action for Application No. 101132377 dated Oct. 21, 2014.

* cited by examiner

LIGHT EMITTER PACKAGES AND DEVICES HAVING IMPROVED WIRE BONDING AND RELATED METHODS

PRIORITY CLAIM

This application claims priority to U.S. Provisional Patent Application 61/531,483 filed on Sep. 6, 2011.

TECHNICAL FIELD

The subject matter disclosed herein relates generally to wire bonding of light emitter devices such as light emitting diode (LED) chips. More particularly, the subject matter disclosed herein relates to light emitter devices and methods providing improved wire bonding for improved thermal resistance.

BACKGROUND

Light emitting devices, such as light emitting diodes (LEDs or LED chips), are currently used in many different general lighting applications and systems, for example, in products targeting replacement of incandescent, fluorescent, and metal halide high-intensity discharge (HID) products. Thermal management and heat dissipation within LED packages is one area of concern to LED chip and/or LED package manufacturers, as poor thermal management can degrade the performance of LED chips and result in poor reliability of LED packages or LED products. Currently, one or more LED chips can be mounted or die attached to underlying substrates or within packages using an epoxy die attach material. The attached LED chip can then be wire bonded to electrically connect the chip to an electrical element. Wire bonding within conventional packages using conventional methods typically requires heating the LED chip and underlying substrate to an elevated temperature above 150° C. Such elevated temperatures can thermally stress the LED chip and/or create high thermal resistance at the LED chip/substrate junction when epoxy is used, each of which can adversely affect LED chip performance. In one aspect, brightness and forward voltage (Vf) are adversely affected, both of which do not recover. Conventional packages and methods which provide for high temperature, non-improved wire bonding can result in a high thermal resistance of approximately 220° C./W or more. Thus, minimizing thermal resistance within LED chips and/or LED packages is both needed and desired for establishing a good bond between the LED chip and underlying substrate and to obtain desired optical performance from the LED chip and/or LED package.

Accordingly, a need remains for light emitter packages and devices having improved wire bonding and related methods, for example, by providing an improved wire bond via controlling various wire bonding parameters. Packages, devices, and methods having improved wire bonds can improve the integrity of the bond between the chip and underlying substrate and thus significantly improve the thermal resistance at the LED chip/substrate interface.

SUMMARY

In accordance with this disclosure, novel light emitter packages incorporating emitter devices having improved wire bonds and methods thereof for improved thermal resistance are provided. It is, therefore, an object of the present disclosure herein to provide packages, devices, and methods which utilize one or more predetermined, improved wire bonding parameters for improved thermal resistance of LED chips that are bonded to an underlying substrate using an epoxy die attach material.

This and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
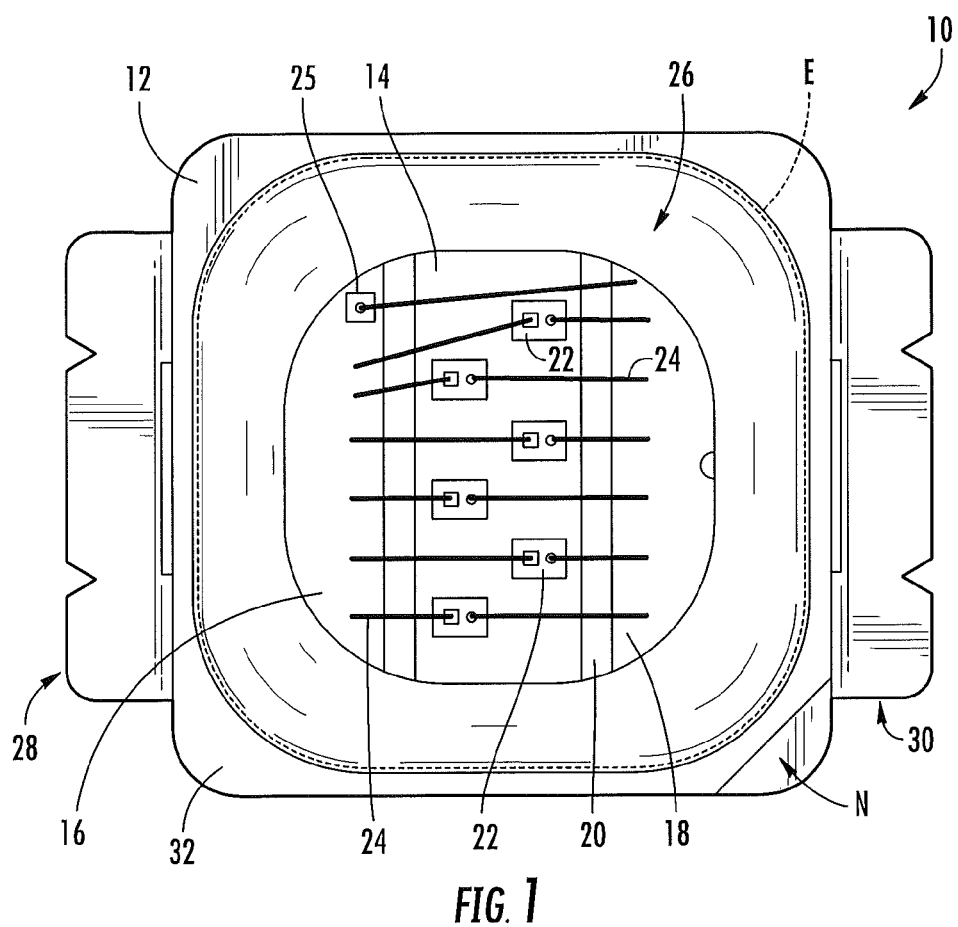
FIGS. 1 and 2 are top and perspective view of one aspect of a light emitting diode (LED) package according to the subject matter herein.
Figure 2:
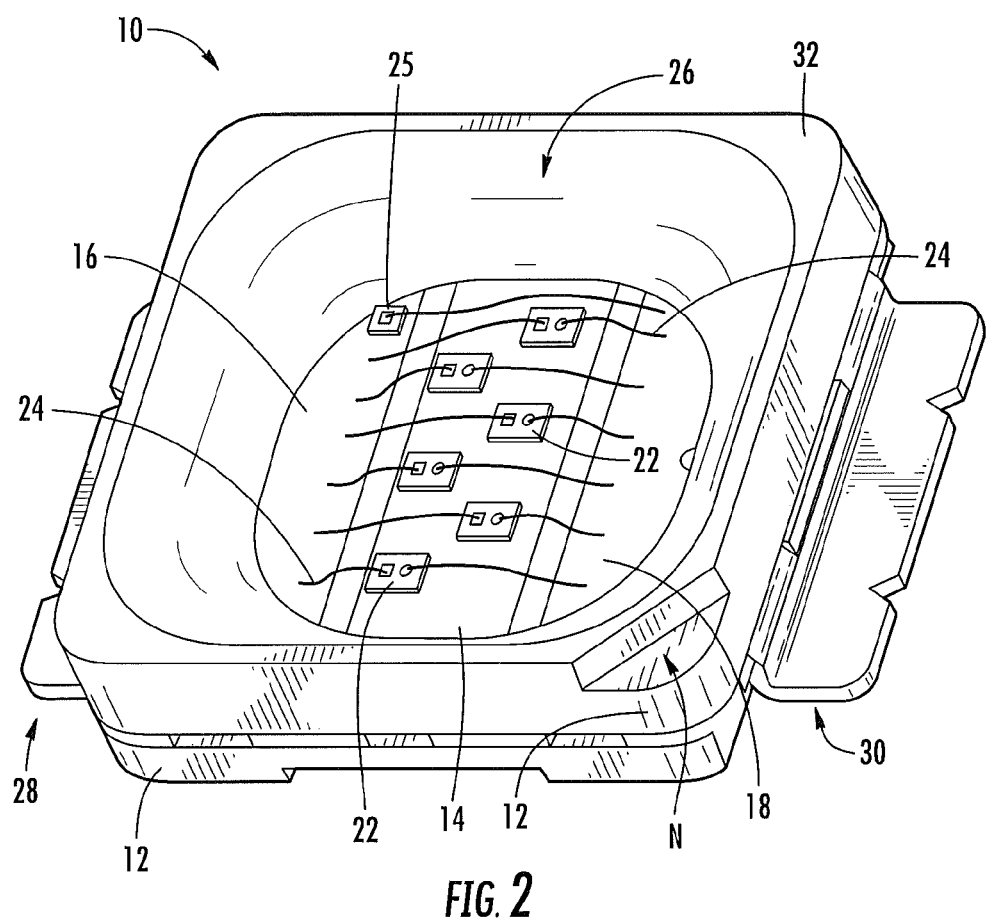

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the feature in addition to the orientation depicted in the figures. For example, if a feature in the figures is turned over, structure or portion described as "above" other structures or portions would now be oriented "below" the other structures or portions. Likewise, if features in the figures are rotated along an axis, structure or portion described as "above", other structures or portions would now be oriented "next to" or "left of" the other structures or portions. Like numbers refer to like elements throughout.

Light emitter devices according to embodiments described herein may comprise group III-V nitride (e.g., gallium nitride) based light emitting diodes (LEDs or LED chips) or lasers fabricated on a growth substrate, for example, a silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946, 547; and U.S. Pat. No. 5,200,022, the disclosures of which are incorporated by reference herein in their entireties. Any other suitable growth substrates are contemplated herein. For example, sapphire and gallium arsenide can be utilized as growth substrates for fabricating LED chips or lasers as described herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein comprise a growth substrate, it will be understood by those skilled in the art that the crystalline epitaxial growth substrate on which the epitaxial layers comprising an LED chip are grown may be removed, and the freestanding epitaxial layers may be mounted on a substitute carrier substrate or substrate which may have different thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LED chips according to some embodiments of the present subject matter, for example, may be fabricated on growth substrates (such as a silicon carbide substrates) to provide horizontal chips (with both electrical contacts on a same side of the LED chip) or vertical chips (with electrical contacts on opposite sides of the LED chip). Moreover, the growth substrate may be maintained on the LED chip after fabrication or removed (e.g., by etching, grinding, polishing, etc.). The growth substrate may be removed, for example, to reduce a thickness of the resulting LED chip and/or to reduce a forward voltage through a vertical LED chip. A horizontal chip (with or without the growth substrate), for example, may be flip chip bonded (e.g., using solder) to a carrier substrate or printed circuit board (PCB), or wire bonded. A vertical chip (without or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LED chips can be coated, at least partially, with one or more phosphors with the phosphors absorbing at least a portion of the LED chip light and emitter a different wavelength of light such that the LED chip emits a combination of light from the LED chip and the phosphor. In one embodiment, the LED chip emits a white light combination of LED chip and phosphor light. One or more LED chips can be coated and fabricated using many different methods, with one suitable method being described in U.S. patent application Ser. Nos. 11/656,759 and 11/899, 790, both entitled "Wafer Level Phosphor Coating Method and Devices Fabricated Utilizing Method", and both of which are incorporated herein by reference in their entireties. Other suitable methods for coating one or more LED chips are described in U.S. patent application Ser. No. 22/014,404 entitled "Phosphor Coating Systems and Methods for Light Emitting Structures and Packaged Light Emitting Diodes Including Phosphor Coating" and the continuation-in-part application U.S. patent application Ser. No. 22/717,048 entitled "Systems and Methods for Application of Optical Materials to Optical Elements", the disclosures of which are hereby incorporated by reference herein in their entireties. LED chips can also be coated using other methods such electrophoretic deposition (EPD), with a suitable EPD method described in U.S. patent application Ser. No. 11/473, 089 entitled "Close Loop Electrophoretic Deposition of Semiconductor Devices", which is also incorporated herein by reference in its entirety. It is understood that light emitter packages according to the present subject matter can also have multiple LED chips of different colors, one or more of which may be white emitter.

Referring now to FIGS. 1 to 5B, FIGS. 1 and 2 illustrate top and perspective views of an LED package, generally designated 10. In one aspect, LED package 10 can comprise a surface mount device (SMD) comprising a body 12 which can be molded or otherwise formed about a leadframe. Leadframe can comprise a substrate or thermal element 14 and one or more electrical elements 16 and 18, respectively. A corner notch, generally designated N can indicate electrical polarity of electrical elements 16 and 18. Thermal and electrical elements 14, 16, and 18 can comprise an electrically and/or thermally conductive material such as a metal or metal alloy. In one aspect, thermal element 14 can be electrically and/or thermally isolated from the one or more electrical elements 16 and 18 by one or more isolating portions 20 of the body. One or more LED chips 22 can be mounted over mounting substrate or thermal element 14 using any suitable die attach technique and/or materials, for example only and not limited to an epoxy die attach (e.g., silicone or silver (Ag) epoxy) or a metal-to-metal die attach technique such as flux assisted eutectic, non-eutectic, or thermal compression die attach. LED chips 22 can be electrically connected to each electrical element 16 and 18 via one or more electrically conductive wire bonds 24. Wire bonds 24 can communicate an electrical current or signal from electrical elements 16 and 18 to one or more LED chips 22 thereby causing illumination of the LED chips 22. As discussed further herein, LED chips 22 can be electrically connected to electrical elements 16 and/or 18 via an improved wire bond established by controlling various wire bonding parameters Body 12 can comprise any suitable material molded or otherwise disposed about thermal and electrical elements 14, 16, and 18, for example, a ceramic material or a molded plastic material such as polyamide (PA), polyphthalamide (PPA), or silicone. At least one electrostatic discharge (ESD) protection devices 25 can be disposed within package 10 and can be electrically connected to electrical elements 16 and 18 and reverse biased with respect to LED chips 22. ESD devices 25 can protect against damage from ESD within package 10. In one aspect, different elements can be used as ESD protection devices 25 such as various vertical silicon (Si) Zener diodes, different LED chips arranged reverse biased to LED chips 22, surface mount varistors and lateral Si diodes.

Body 12 of package 10 can comprise a cavity, generally designated 26, for example, a reflector cavity optionally coated with a reflective material for reflecting light from the one or more LED chips 22. As the dotted line in FIG. 1 illustrates, cavity 26 can be filled with an encapsulant E. Encapsulant E can comprise one or more phosphor materials for interacting with light emitted from the one or more LED chips 22 to emit light from package 10 having a desired color. Encapsulant E can be filled to any level within cavity 26 and may be disposed below and/or above a top surface 32 of package 10 as known in the art. In one aspect, encapsulant E can be filled such that it is flush with top surface 32 of package. In other aspects, encapsulant E can be filled such that it forms a concave or convex surface with respect to top face 32 of package 10.

Electrical elements 16 and 18 can extend from one or more lateral sides of body 12 and form one or more external tab portions generally designated 28 and 30. Tab portions 28 and 30 can bend to form one or more mounting surfaces such that package 10 can be mounted to an underlying substrate. Tab portions 28 and 30 can bend away from each other or inwardly towards each other thereby adapting either a J-bend or gull-wing orientation as known in the art. However, any configuration of external tabs 28 and 30 is contemplated.

Figure 3:
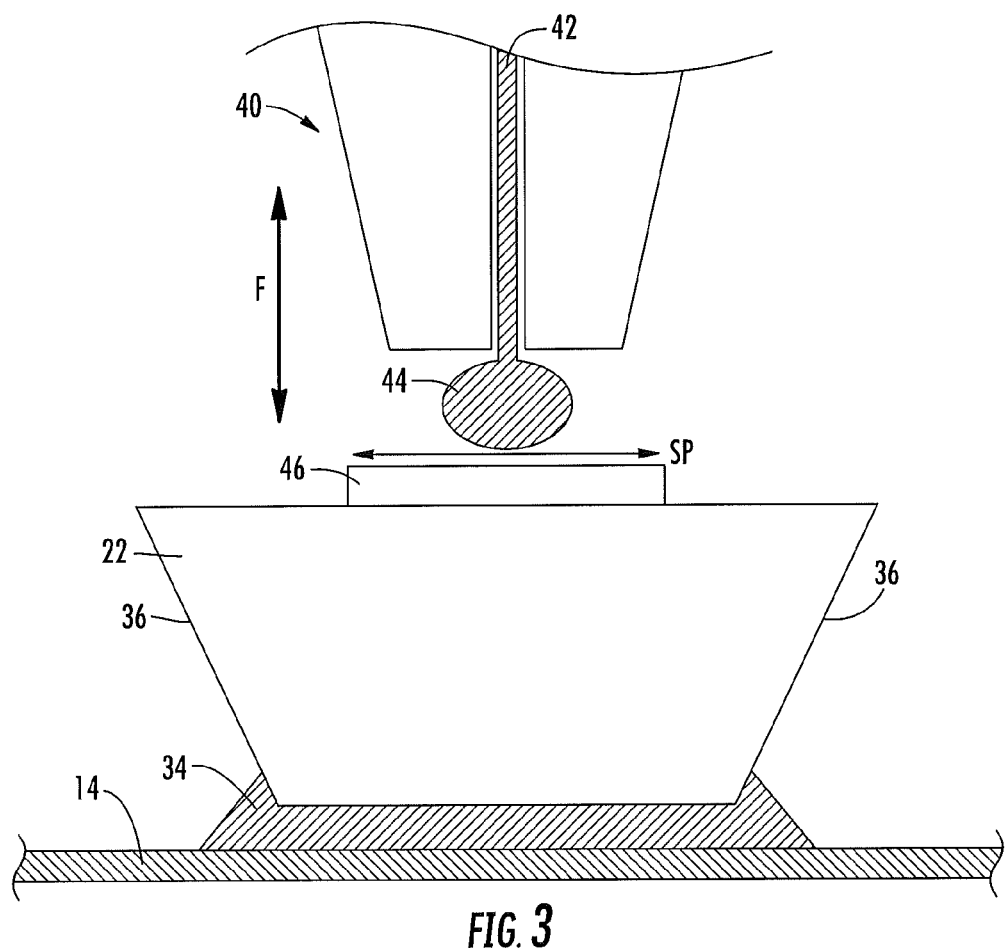
FIG. 3 is a sectional view of an LED chip during wire bonding according to the disclosure herein.
Figure 5A:
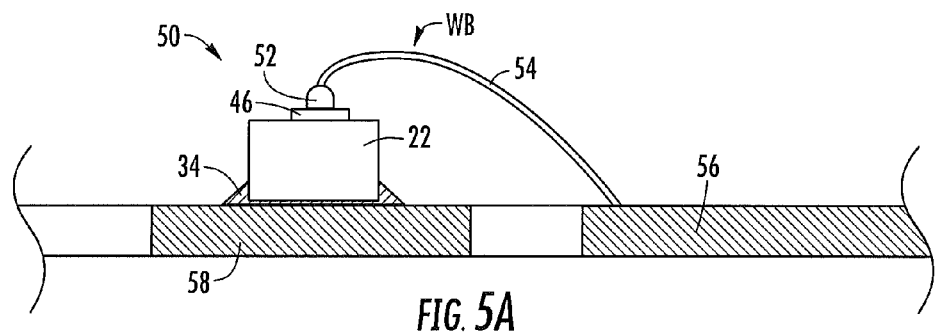
FIGS. 5A and 5B are portions of LED packages according to the disclosure herein.

FIG. 3 is a sectional view of an LED chip 22 during wire bonding. LED chip 22 can be mounted or otherwise attached to a substrate, for example, thermal element 14. In one aspect, LED chip 22 can be attached to thermal element 14 via a die attach material 34 disposed between LED chip 22 and thermal element 14. LED chip 22 can, for example and without limitation, comprise a high torque chip that can have angled sides 36 extending between a bottom of the chip which can have a smaller surface area than a top surface of the chip. Sides 36 could be angled opposite that shown or could be straight cut (FIG. 5A). Any size, shape, color, orientation, or dimension of LED chip 22 can be used. LED chip 22 can comprise a horizontal or vertical build. In one aspect, die attach material 34 can facilitate bonding between LED chip 22 and thermal element 14 and can comprise any suitable epoxy die attach material. For example, die attach material 34 can comprise a high index silicone epoxy or a silver (Ag) epoxy. In some aspects, a high index silicone epoxy is preferred and/or advantageous as it can absorb less light than darker the Ag epoxy. In some aspects, die attach material 34 can extend beyond the bottom surface area of LED chip 22 and extend at least partially up one or more sides 36 of LED chip 22. Die attach material 34 can comprise a glass transition temperature ($T_g$) which is the temperature at which the transition in the amorphous regions between the glassy and rubbery state occurs. As further described below, heating LED chip 22 and/or thermal element 14 above the $T_g$ of the die attach material 34 can affect the bond strength between LED chip 22 and thermal element 14 and can result in an increased thermal resistance at LED chip 22 and thermal element 14 interface. It is advantageous to reduce the thermal resistance of the LED package 10 as optical properties including package brightness and Vf can be improved.

FIG. 3 further illustrates a capillary, generally designated 40, of a wire bonding machine (not shown) which has been threaded with a wire bonding material 42 for performing a wire bonding process. Wire bonding material 42 can comprise a wire filament of any suitable electrically conductive material such as a metal or metal alloy, for example only and not limited to gold (Au). Capillary 40 can comprise a portion of any type of wire bonding machine known in the art, for example only and not limited to wire bonding machines manufactured by Kulicke & Soffa (K&S) headquartered in Singapore, or any of the Eagle or Hawk series of wire bonding machines manufactured by ASM Pacific Technologies Ltd., headquartered in Hong Kong, China. However, any suitable wire bonding machine utilizing a threaded capillary is contemplated. Wire bonding material 42 can comprise a lower mass 44 of bonding material 42 formed using, for example, an electrical flame off component (not shown). Mass 44 can attach to a bond pad 46 of LED chip 22 and a wire bond WB (FIGS. 5A and 5B) can form. This wire bonding process is typically controlled within desired conditions or parameters. In accordance with the disclosure herein, controlling the wire bonding process within improved ranges of time, force, power, and/or temperature can produce surprising results and can better maintain the integrity of the bond between LED chip 22 and thermal element 14, and thereby decrease thermal resistance of LED package 10 (FIG. 1). LED package 10 can comprise any suitable package or component such as a ceramic based LED package and/or a plastic based LED package molded about one or more leadframes.

Time of the wire bonding process for providing one or more wire bonds for LED chips 22 within package 10 can be improved and/or controlled within an improved range. Time of the wire bonding process can comprise a period of time during which mass 44 can be held in contact and with bond pad 46 to thermally attach mass 44 to bond pad 46 thereby creating the wire bond. According to the subject matter herein, wire bonding within an improved time range has been found to maintain integrity of die attach material 34 during the wire bonding process. Failures of LED chips 22 and therefore package 10 based upon a damaged bond or interface between LED chip 22 and thermal element 14 can be reduced when wire bonds are provided via processes performed at one or more improved parameters of time, force, power, and/or temperature. In one aspect, improved wire bonding time comprises a range of time from approximately 2 to 100 milliseconds (ms).

In one aspect, improved wire bonding time comprises a range of time from approximately 2 to 15 ms. In one aspect, improved wire bonding time comprises a range of time from approximately 15 to 30 ms. In one aspect, improved wire bonding time comprises a range of time from approximately 30 to 50 ms. In one aspect, improved wire bonding time comprises a range of time from approximately 50 to 75 ms. In other aspects, improved wire bonding time comprises a range of time from approximately 75 to 100 ms. As stated earlier, any range of wire bonding time between approximately 2 and 100 ms is hereby contemplated as comprising an improved wire bonding time. Table 1 below illustrates thermal resistance data for LED chips or packages having LED chips wire bonded using various wire bonding parameters such as bonding temperature, time, power, and force. The characterization of "high" thermal resistance is, for example, approximately 220° C./W or more. The characterization of "low" thermal resistance is, for example, approximately 220° C./W or less, for example 60° C./W more or less. As table 1 illustrates, the parameters of time, force, power, and temperature can be varied, balanced, and/or improved to obtain instances of low thermal resistance. In one aspect, an improved wire bonding time can be approximately 30 ms or less. For example, an improved wire bonding time can be approximately 18 to 30 ms as shown in Table 1.

TABLE 1

Experimental Data with Optimized Parameters for Low Thermal Resistance

| Lot Name | Bonding Temperature [° C.] | Bonding Time [ms] | Bonding (Scrubbing) Power[1] | Bonding Force [gf] | Thermal Resistance ($R_{th}$) |
|---|---|---|---|---|---|
| Lot A | 128 | 18 | 110 | 38 | high |
| — | 154 | 30 | 100 | 40 | high |
| Lot E | 30 | 30 | 100 | 3 | low |
| Lot F | 128 | 30 | 100 | 3 | low |
| Lot G | 128 | 30 | 50 | 40 | low |
| Lot H | 128 | 30 | 35 | 40 | Low |

[1]Unit is DAC (Digital Analog Convert). 1 DAC equals can be expressed as milliwatts (mW), see Table 2 below. DAC may change depending on power calibration and transducer impedance. (source: ASM)

Still referring to FIG. 3, bonding power or scrubbing power indicated by arrow SP can be improved and/or controlled within an improved range. Ultrasonic energy can provide the mechanical scrubbing power SP which can generate a frictional heat to help thermally bond mass 44 to bond pad 46. Devices and methods according to the subject matter herein can utilize an improved range of scrubbing power SP for attaching mass 44 to bond pad 46. In one aspect, improved scrubbing power SP can be from approximately 35 to 255 digital analog convert (DAC). One DAC corresponds to a number of mW and can change depending on power calibration and transducer impedance of the wire bonding machine. In one aspect, improved scrubbing power SP can be from approximately 35 to 75 DAC. In one aspect, improved scrubbing power SP can be from approximately 75 to 150 DAC. In further aspects, improved scrubbing power SP can be from approximately 150 to 255 DAC.

Table 2 below includes DAC expressed in milliwatts (mW). An improved scrubbing power SP can be between approximately 35 and 255 DAC, which can also be expressed as between approximately 60 and 1700 mW.

TABLE 2

Approximate Values Associated With Improved Scrubbing Power (SP) as Expressed in DAC and mW

| Power (DAC) | Power (mW) |
|---|---|
| 50 | 62.6 |
| 80 | 161.6 |
| 128 | 424.1 |
| 150 | 576.3 |
| 255 | 1654.2 |

Thus, as stated earlier, any range of scrubbing power SP between approximately 35 and 255 DAC is contemplated as comprising an improved scrubbing power. An improved scrubbing power SP can also be between approximately 60 and 1700 mW as indicated by Table 2 above. Ranges of improved scrubbing power SP are also contemplated herein, such as between approximately 60-100 mW; 100-200 mW; 200-450 mW; 450-600 mW; 600-900 mW; 900-1200 mW; 1200-1500 mW; and 1500-1700 mW. In one aspect, improved scrubbing power SP can be approximately 110 DAC or less as illustrated by Table 1 above. For example, improved scrubbing power can be from approximately 35 to 50 DAC or 50 to 100 DAC. Bonding within such ranges can be considered improved as it has been found that bonding within such ranges either alone and/or in combination with other parameters such as time, force, or temperature can maintain the integrity of die attach material 34 during wire bonding.

Force of the wire bonding process, or bonding force indicated by the arrow F in FIG. 3, for providing one or more wire bonds of LED chips 22 within LED package 10 can also be improved and/or controlled within an improved range. Force can be improved such that the integrity of die attach material 34 during wire bonding can be maintained which can result in a lower thermal resistance and improved heat management within package 10. Thus, degradation of either the LED chip optical performance or the bond interface between LED chip 22 and thermal element 14 can be reduced. Bonding force F can comprise the force at which capillary 40 deposits mass 44 onto bond pad 46. In one aspect, improved force F can be from approximately 1 to 100 grams force (gf). For example only and in one aspect, improved force F can be from approximately 1 to 3 gf. In other aspects, improved force F can be from approximately 3 to 40 gf. In further aspects, improved force F can be from approximately 40 to 100 gf. As stated earlier, any range of force F between approximately 1 and 100 gf is hereby contemplated as comprising an improved bonding force. As illustrated in previously described Table 1, improved force F can be approximately 40 gf or less. For example, improved force F can range from approximately 3 to 35 gf, 35 to 38 gf, or 38 to 40 gf.

Temperature of the wire bonding process, or the bonding temperature for providing one or more wire bonds of LED chips 22 within LED package 10 can also be improved and/or controlled within an improved temperature range. Temperature can comprise the temperature to which the LED chip 22 and/or thermal element 14 are heated during wire bonding. Devices and methods according to the subject matter disclosed herein utilize low temperature wire bonding for attaching mass 44 to bond pad 46 which has been found to maintain the integrity of the LED chip 22 and thermal element 14 interface and thus significantly improve bond results between the LED chip 22 and thermal element 14, thereby significantly reducing thermal resistance of package 10. In one aspect, temperature of the wire bonding process can comprise an improved temperature range from approximately 1 to 150° C. For example, in one aspect an improved temperature range of the wire bonding process can comprise approximately 1 to 30° C. In other aspects, an improved temperature range of the wire bonding process can comprise approximately 30 to 100° C. For example, in one aspect an improved temperature range of the wire bonding process can comprise approximately 100 to 150° C. In yet further aspects, temperature of the wire bonding process which attaches mass 44 to bond pad 46 can comprise approximately 150° C. or less, such as improved temperature ranges of approximately 1 to 50° C., 50 to 100° C., 100 to 150° C., and/or 149° C. or less.

As indicated in previously described Table 1 above, an improved temperature of wire bonding process can comprise approximately 128° C. or less. LED package 10 can comprise an LED chip 22 attached to electrical element via a wire bond WB (FIGS. 5A and 5B) provided at a temperature that can be approximately equal to the $T_g$ or lower than the $T_g$ of die attach material 34, for example, a temperature less than or equal to the $T_g$ of silicone epoxy which is approximately 140° C. or less. Wire bonding at temperatures above the $T_g$ of the die attach material 34 is not as advantageous as the die attach material 34 can be stressed and degraded at elevated temperatures and a change can occur in the bond material between the LED chip 22 and thermal element 14, thus degrading the ability of package 10 to manage heat and resulting in a high thermal resistance. LED chips perform most efficiently when cool, and best when they are not heat stressed during manufacturing. Low temperature wire bonding in accordance with the disclosure herein at equal to approximately 150° C. (such as 149° C. or less) can be advantageous.

Improved wire bonding can comprise wire bonding at lower temperatures and has been shown to significantly reduce the thermal resistance to approximately 60° C./W, which is about a 50 percent improvement over conventional techniques. Notably, package 10 can have a low thermal resistance, for example, a thermal resistance of less than approximately 220° C./W when LED chips 22 are wire bonded at lower temperatures. In one aspect, package 10 can comprise a low thermal resistance of less approximately 0 to 50° C./W, 50 to 100° C./W, 100 to 150° C./W or 150 to 220° C./W. Any thermal resistance between 0 and 220° C./W is hereby contemplated as a low thermal resistance which can be improved in package 10 for example, by varying, balancing, and/or optimizing the parameters of time, force, power, and temperature to obtain instances of low thermal resistance. A low thermal resistance within a package is advantageous as a significantly improved bond can result between LED chip 22 and thermal element 14 as integrity of the die attach material 34 is maintained at lower temperatures. This allows heat to dissipate more easily from LED chip which in turn can increase LED chip 22 performance. Die attach material 34 is, therefore, not compromised during optimization of the wire bonding parameters of temperature, time, power, and force application.

Figure 4:
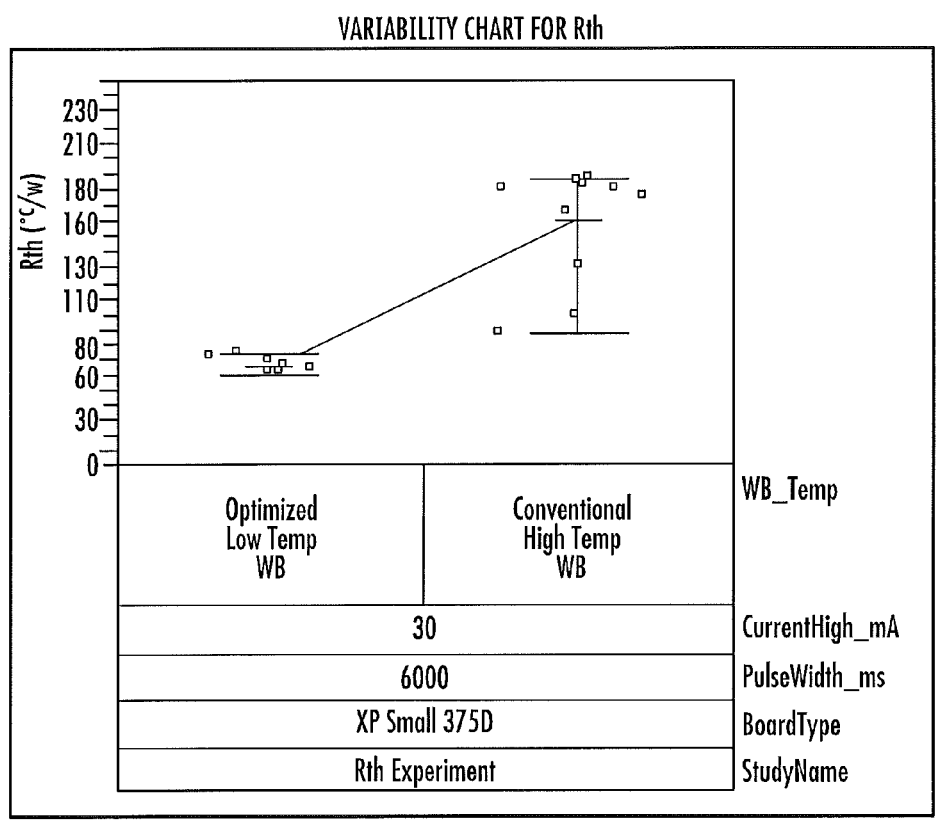
FIG. 4 is a graphical illustration of the thermal resistance for LED chips wire bonded at improved versus non-improved temperatures.

FIG. 4 is a graph illustrating the differences between improved low temperature wire bonding and conventional, high temperature wire bonding. The graph and values represent Au wire (specifically 99.99% 4-9s wire as known in the art) which can comprise an approximately 1 mil diameter wire. The concept is also true, for example, for Cu wire, Ag wire, AuSn coated or AuSn wire, Pt coated Ag wire, 3-9s wire, 2-9s wire, etc. The concept is also true for 0.8, 1.25, 2.0 mil, etc. diameter wires as well. The values can basically follow a psi type relationship, meaning a 1 mil wire with a 75 um ball requires power of approximately 100 and force of 35, if a 1.25 mil wire is used with a ball of 90 um, the force and power would scale by the ratio of the area for a near equivalent bond (one would then tune to get matching parameters such as pulls and shears and shape etc.).

Conventional, high temperature wire bonding comprises wire bonding at elevated temperatures more than 150° C., while improved low temperature wire bonding can be performed at temperatures equal to and/or less than approximately 150° C., and/or approximately equal to or less than the $T_g$ of die attach material 34. For example, in some aspects, improved wire bonding temperature can comprise ranges of approximately 1 to 50° C., 50 to 100° C., and/or 100 to 150° C. as previously discussed. In other aspects, improved wire bonding temperature can comprise any temperature ranging from approximately 1° C. to 150° C. as previously discussed. As FIG. 4 illustrates, the thermal resistance ($R_{th}$) of package such as package 10 wire bonded at improved temperatures is less than approximately 80° C./W at 30 mA and can average approximately 60° C./W. This is a significant improvement over the $R_{th}$ of package wire bonded at conventional temperatures which averages approximately 170° C./W at 30 mA. In some instances, $R_{th}$ of conventional packages can comprise approximately 220° C./W or more at 30 mA. Wire bonding at lower temperatures therefore can advantageously lower the thermal resistance to less than approximately 220° C./W, considered a low $R_{th}$ which can improve the bond between LED chip 22 and thermal element 14, and can further optimize thermal and optical performance of LED packages or products, such as LED package 10 or any other suitable LED package in which LED chips 22 are wire bonded.

Figure 5B:
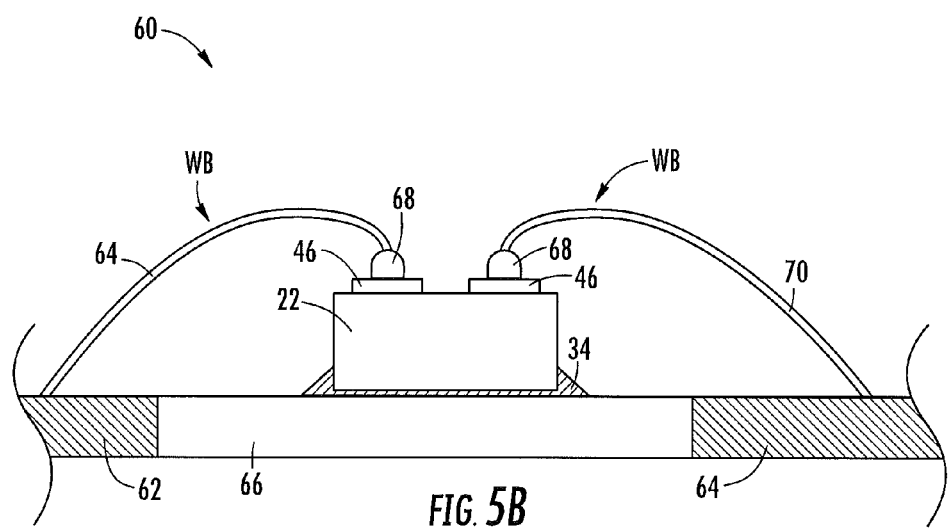

FIGS. 5A and 5B illustrate portions of different LED packages, generally designated 50 and 60, respectively, which can comprise LED chips wire bonded at improved parameters. That is, the portions of LED packages 50 and 60 can comprise light emitters in which wire bonds generally designated WB are provided within improved wire bonding parameters. The portions of LED packages 50 and 60 can illustrate different builds of LED chips which could be used in package 10. FIG. 5A illustrates package 50 comprising an LED chip 22 over which a wire bond WB is provided. Wire bond WB can comprise a ball 52 and a tail 54. LED package can further comprise an electrical element 56 similar to previously described electrical elements 16 and 18 of package 10. Ball 52 can be attached to and in electrical communication with bond pad 46 of LED chip 22. Tail 54 can be electrically connected or stitched to electrical element 56. Electrical current or signal can therefore flow through LED chip 22 where the electrical energy is converted into light. LED package 50 can further comprise a substrate 58 over which one or more LED chips 22 can be provided.

Substrate 58 can be similar in form and function to thermal element 14 of package 10. Substrate 58 can comprise an electrically and/or thermally conductive material such as a metal or metal alloy. LED package 50 can further comprise die attach material 34 that can be disposed between LED chip 22 and substrate 58. Die attach material 34 can comprise an epoxy material as previously described. Wire bond WB can be provided via a process utilizing improved time, power, force, and temperature parameters such as previously described. That is, in one aspect, an improved time range can be from approximately 2 to 100 ms, an improved scrubbing power SP can be from approximately 35 to 255 DAC (e.g., between approximately 60 mW and 1700 mW), an improved force F can be from approximately 1 to 100 gf, and an improved temperature can be from approximately 0 to 150° C. Any specific number, range, and/or sub-range within these improved time, power, force, and/or temperature ranges (e.g., such as previously discussed above and/or referring to Table 1) are hereby contemplated.

The ranges identified above are considered improved as the integrity of die attach material 34 can be better maintained during the wire bonding process, and therefore a lower thermal resistance results and the package can have improved reliability. In one aspect, the improved thermal resistance can comprise approximately 220° C./W or less, for example a range from 80 to 220° C./W. In other aspects, the improved thermal resistance can be approximately 80° C./W or less, for example a range from 60 to 80° C./W. In further aspects, the thermal resistance of packages using improved time, force, power, and/or temperature parameters can be approximately 60° C./W or less. For example, in one aspect the improved thermal resistance can be from approximately 0 to 20° C./W. In other aspects, the improved thermal resistance can be from approximately 20 to 40° C./W. In yet further aspects, the improved thermal resistance can be from approximately 40 to 60° C./W. Each parameter (e.g., time, force, power, and/or temperature) can comprise an improved range that can be used alone and/or in combination with other parameters having improved ranges. That is, providing a wire bond WB while controlling one parameter can be the only improved parameter of the wire bonding process, or the wire bonding process can combine one or more improved parameter with one or more of the other improved parameters.

FIG. 5B illustrates LED package 60 which has been wire bonded at improved parameters of time, force, power, and/or temperature. LED package 60 can comprise an LED chip 22 having more than one bond pad 46. Wire bonds WB can be provided to electrically connect LED chip 22 to one or more electrical elements 62 and 64. Elements 62 and 64 can be similar in form and function to previously described elements 16 and 18 of package 10 (FIG. 1). LED chip 22 can be disposed over a substrate 66 that can comprise a thermally conductive but electrically isolating material such as a plastic or ceramic material. Substrate 66 can be similar in form and function to previously described thermal element 14 disposed within package 10. LED package 60 can further comprise die attach material 34 disposed between LED chip 22 and substrate 66. Wire bond WB can comprise a ball 68 and a tail 70, where ball 68 can electrically communicate with bond pad 46 of LED chip 22 and tail 70 can electrically communicate with electrical element 64 such that electrical energy or current can pass into and illuminate LED chip 22. The one or more wire bonds WB can be provided via a process utilizing improved time, power, force, and/or temperature parameters such as previously described. The improved parameters can allow the integrity of die attach material 34 to be maintained during the wire bonding process, and therefore a lower thermal resistance within LED package 60 can result. In one aspect, the improved thermal resistance can be approximately 220° C./W or less, for example a range from 80 to 220° C./W. In other aspects, the improved thermal resistance can be approximately 80° C./W or less, for example a range from 60 to 80° C./W. In further aspects, the thermal resistance of LED chips and/or packages using improved time, force, power, and/or temperature parameters can be approximately 60° C./W or less. For example, in one aspect the improved thermal resistance can be from approximately 0 to 20° C./W. In other aspects, the improved thermal resistance can be from approximately 20 to 40° C./W. In yet further aspects, the improved thermal resistance can be from approximately 40 to 60° C./W.

Embodiments of the present disclosure shown in the drawings and described above are exemplary of numerous embodiments that can be made within the scope of the appended claims. It is contemplated that the configurations of light emitter device wire bonding and methods thereof for improved thermal resistance can comprise numerous configurations other than those specifically disclosed. In sum, light emitter packages and methods disclosed herein can comprise providing wire bonds on LED devices such as chips at one or more improved parameters such as predetermined improved ranges of time, force, power, and/or temperature. Package including improved wire bonded devices such as LED chips can comprise low thermal resistance, less than approximately 220° C./W and in some instances approximately 60° C./W or less.

What is claimed is:

1. A method of providing a light emitter package, the method comprising:
   providing at least one light emitting diode (LED) chip;
   providing an electrical element; and
   wire bonding the at least one LED chip to the electrical element at a temperature of approximately 150° C. or less; and
   wherein wire bonding the LED chip to the electrical element further comprises at least one of:
   wire bonding at a force of approximately 100 grams force (gf) or less;
   wire bonding at a power of approximately 1700 mW or less; or
   wire bonding at a time of approximately 100 milliseconds (ms) or less.

2. The method of claim 1, further comprising providing a substrate bonded to the at least one LED chip.

3. The method of claim 2, further comprising providing an epoxy die attach material disposed between the substrate and the at least on LED chip.

4. The method of claim 2, wherein the light emitter package comprises a thermal resistance of approximately 220° C./W or less.

5. The method of claim 2, wherein the package comprises a thermal resistance of approximately 80° C./W or less.

6. The method of claim 2, wherein the package comprises a thermal resistance of approximately 60° C./W or less.

7. The method of claim 2, further comprising wire bonding at the force of approximately 100 grams force (gf) or less.

8. The method of claim 2, further comprising wire bonding at the power of approximately 1700 mW or less.

9. The method of claim 2, further comprising wire bonding at the time of approximately 100 milliseconds (ms) or less.

10. A method of providing a light emitter package, the method comprising:
    providing a substrate;
    providing at least one light emitting diode (LED) chip; and
    bonding the at least one LED chip to the substrate using a silicone epoxy;
    providing an electrical element;
    wire bonding the LED chip to the electrical element at a temperature approximately equal to or less than a glass transition temperature of the silicone epoxy; and
    wherein wire bonding the LED chip to the electrical element further comprises at least one of:
    wire bonding at a force of approximately 100 grams force (gf) or less;
    wire bonding at a power of approximately 1700 mW or less; or
    wire bonding at a time of approximately 100 milliseconds (ms) or less.

11. The method of claim 10, wherein the silicone epoxy comprises a glass transition temperature of approximately 140° C. or less.

12. The method of claim 10, wherein providing the substrate comprises providing a ceramic material.

13. The method of claim 10, wherein providing the substrate comprises providing a metal.

14. The method of claim 10, wherein the substrate is provided within an LED package.

15. The method of claim 10, further comprising wire bonding at the force of approximately 100 grams force (gf) or less.

16. The method of claim 10, further comprising wire bonding at the power of approximately 1700 mW or less.

17. The method of claim 10, further comprising wire bonding at the bonding time of approximately 100 milliseconds (ms) or less.

18. The method of claim 10, wherein the package comprises a thermal resistance of approximately 220° C./W or less.

19. The method of claim 10, wherein the package comprises a thermal resistance of approximately 80° C./W or less.

20. The method of claim 10, wherein the package comprises a thermal resistance of approximately 60° C./W or less.

21. A method of providing a light emitter package, the method comprising:
- providing at least one light emitting diode (LED) chip;
- providing an electrical element;
- wire bonding the LED chip to the electrical element using a plurality of four predetermined parameters or a combination thereof, the parameters comprising:
- (i) a temperature of approximately 150° C. or less;
- (ii) a bonding time of approximately 100 ms or less;
- (iii) a power of approximately 1700 mW or less; and
- (iv) a force of approximately 100 grams force (gf) or less.

22. The method of claim 21, further comprising providing a substrate bonded to the at least one LED chip.

23. The method of claim 22, further comprising providing an epoxy die attach material disposed between the substrate and the at least on LED chip.

24. The method of claim 21, wherein the package comprises a thermal resistance of approximately 220° C./W or less.

25. The method of claim 21, wherein the package comprises a thermal resistance of approximately 80° C./W or less.

26. The method of claim 21, wherein the package comprises a thermal resistance of approximately 60° C./W or less.

\* \* \* \* \*